United States Patent
Hirota (10) Patent No.: US 6,936,833 B2
(45) Date of Patent: Aug. 30, 2005

(54) SEMICONDUCTOR DEVICE PACKAGE HAVING A SWITCHER CONNECTING PLURAL PROCESSING ELEMENTS

(75) Inventor: Toshiyuki Hirota, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/939,672

(22) Filed: Aug. 28, 2001

(65) Prior Publication Data

US 2002/0043664 A1 Apr. 18, 2002

(30) Foreign Application Priority Data

Aug. 28, 2000 (JP) .................................... 2000-256746

(51) Int. Cl.[7] ............................................. G02B 27/00
(52) U.S. Cl. ........................................ 250/551; 385/14
(58) Field of Search ............................ 250/551, 214.1, 250/227.11; 385/14, 15, 88–94, 49; 257/432

(56) References Cited

U.S. PATENT DOCUMENTS

| | | | | |
|---|---|---|---|---|
| 4,917,450 A | * | 4/1990 | Pocholle et al. | 385/14 |
| 5,148,504 A | * | 9/1992 | Levi et al. | 385/14 |
| 5,506,961 A | * | 4/1996 | Carlson et al. | 713/200 |
| 5,764,645 A | * | 6/1998 | Bernet et al. | 370/395.52 |
| 6,018,782 A | | 1/2000 | Hartmann | 710/310 |
| 6,154,051 A | * | 11/2000 | Nguyen et al. | 326/41 |
| 6,311,165 B1 | * | 10/2001 | Coutts et al. | 705/21 |
| 6,343,083 B1 | * | 1/2002 | Mendelson et al. | 370/466 |
| 6,343,171 B1 | * | 1/2002 | Yoshimura et al. | 385/14 |
| 6,467,009 B1 | * | 10/2002 | Winegarden et al. | 710/305 |

FOREIGN PATENT DOCUMENTS

| | | |
|---|---|---|
| JP | A 6-103243 | 4/1994 |
| JP | A 7-131063 | 5/1995 |
| JP | Y2 7-46992 | 10/1995 |
| JP | B2 2710536 | 10/1997 |
| JP | A 10-22449 | 1/1998 |
| JP | A 11-243436 | 9/1999 |

* cited by examiner

Primary Examiner—Thanh X. Luu
(74) Attorney, Agent, or Firm—Young & Thompson (57) ABSTRACT

A package includes a plurality of processors 101–104 as processing elements. One of the processing elements is selected as a switcher 110 and the switcher is located at the center of the package. Each of the processors 101–104 includes a corresponding network interface 111–114 which has communication function, and each network interface 111–114 is connected to the switcher 110. Thus constructed packages are laminated and the switchers 110 of the packages are connected to each other via a router 115 and an extra communication port 120 to produce a system LSI.

10 Claims, 8 Drawing Sheets

SEMICONDUCTOR DEVICE PACKAGE HAVING A SWITCHER CONNECTING PLURAL PROCESSING ELEMENTS

BACKGROUND OF THE INVENTION

1. Field of the Invention

The invention relates to a semiconductor device which is capable of forming a system by connecting blocks or modules included in a package or chips and, in particular, a semiconductor device which can be designed flexibly and which can render a design unit in a proper size.

2. Description of the Related Art

In recent years, such a semiconductor has been used as a system LSI in a product, such as a set-top box, a game device, or a digital camera. On the other hand, the product has been required to be small in size, consume less power, and be made at reduced cost.

However, the system LSI is made for each specific art and does not suit for a general-purpose use. Therefore, timing is critical when the LSI is supplied in a market. To this end, a short design period and a short turn around time (TAT) are recently required on designing and manufacturing the LSI.

Also, a degree of integration and performance of the LSI has been remarkably improved in several years. In addition, integration for achieving various functions is needed since the LSI must treat multimedia data including image data and sound data.

Further, a design of the LSI has been more complicated. In order to overcome the complexity, a method is adopted which integrates large-scale macro cells each of which is previously designed. The macro cell is referred to as IP (Intellectual Property), as known in the art.

Thus, the period required to design the LSI is considerably shortened, but it is difficult to prepare and hold all IPs corresponding to many various functions by a single company, even if it is a large company. There are IP providers who design and provide IPs to solve the above problem.

To easily construct the LSI by combining these IPs, a flexibility of the IP must be enhanced and a common interface of the IP must be needed. Then, "VSI (Virtual Socket Interface)" is organized and wherein, a unification of a design environment including IPs is fostered on trial. By the unification, it is possible to construct a system on the LSI by connecting via a common bus various IPs available from many LSI design companies which are different from each other.

For example, there may be a first conventional system in which a core processor and peripheral processors connected via the core processor are arranged on a chip.

In the first conventional system, a connection between process modules is critical and a wiring of the modules is performed over multi-layers. As a result, complexity of the system is increased. Also, when a change of a design of one of the process modules is required, a wiring must be changed. And the change for one module leads to a change of a design of the whole LSI and that is expensive.

To solve this problem, an LSI is proposed which incorporates a communication function to enhance its independency and realize a system having communicating ability Via a network.

For example, a second conventional system is disclosed in JP-Y2 07-46992 (JP-Y 46992/1995). The system (a communication function built-in type LSI) incorporates a communication interface and also serves as a gateway.

However, in the second conventional system, the problem of complexity due to a wiring between elements of the system and an arrangement of the elements has still remained.

The problem becomes serious when a number of chips are arranged in a multi-chip module as processing elements and they are connected via a common bus (first conventional system), or when a number of chips (each of which is an LSI incorporating a communication function) are arranged in a sub network of a system as processing elements and they are connected via a single network bus (second conventional system). In these cases, design of the systems is still complicated, since a distance between chips to be connected is determined based on locations of the chips and a location of a wiring connecting the chips.

SUMMARY OF THE INVENTION

It is, therefore, an object of the invention to solve the above problems.

It is also an object of the invention to provide a semiconductor device for improving a flexibility of design of an arrangement of elements and a wiring of a system.

Further, it is an object of the invention to provide a semiconductor device for simplifying an arrangement of elements and a wiring of a system.

According to a first aspect of the invention, there is provided a semiconductor device which comprises a plurality of processing elements; and a switcher which connects the elements to each other. Wherein, each of the processing elements includes a network interface and is connected to the switcher via the network interface.

Thereby, connections between the processing elements are simplified and a length of each connection line (wiring) can be shortened.

According to a second aspect of the invention, the processing elements are located around the switcher and the switcher is located at the center position of the semiconductor device.

Thereby, a length of connection lines among the processing elements can be minimized.

According to a third aspect of the invention, the processing elements and the switcher can be implemented in a single semiconductor chip or in a single package. Further, one of the processing elements and the switcher can be connected by peer-to-peer connection via at least one transmission line.

According to a fourth aspect of the invention, each of the processing elements has a function of the same hierarchical level. However, If the processing element which is a constitutional unit has the function of the same hierarchical level, communication processing is advantageously simplified.

According to a fifth aspect of the invention, at least one of the processing elements and the switcher are located in a space where the light is confined, and each of the processing element and the switcher has a light emitting element and a light receiving element, thereby an optical communication is performed between the processing element and the switcher.

Such the optical communication is desirable since a degree of integration is increased and clock skew is reduced.

According to a sixth aspect of the invention, the semiconductor device further comprises a plurality of semiconductor chips each of which includes the plurality of processing elements and the switcher, and at least one inter-switcher which connects the semiconductor chips to each other. The configuration is desirable to constitute a plurality of packages by using many semiconductor chip.

According to a seventh aspect of the invention, the plurality of semiconductor chips and the inter-switcher are implemented two-dimensionally. In addition, the inter-switcher is located in one of the plurality of semiconductor chips, and the semiconductor chips are implemented three-dimensionally. Also, each of the switcher and the inter-switcher may be a circuit switching.

Figure 9:
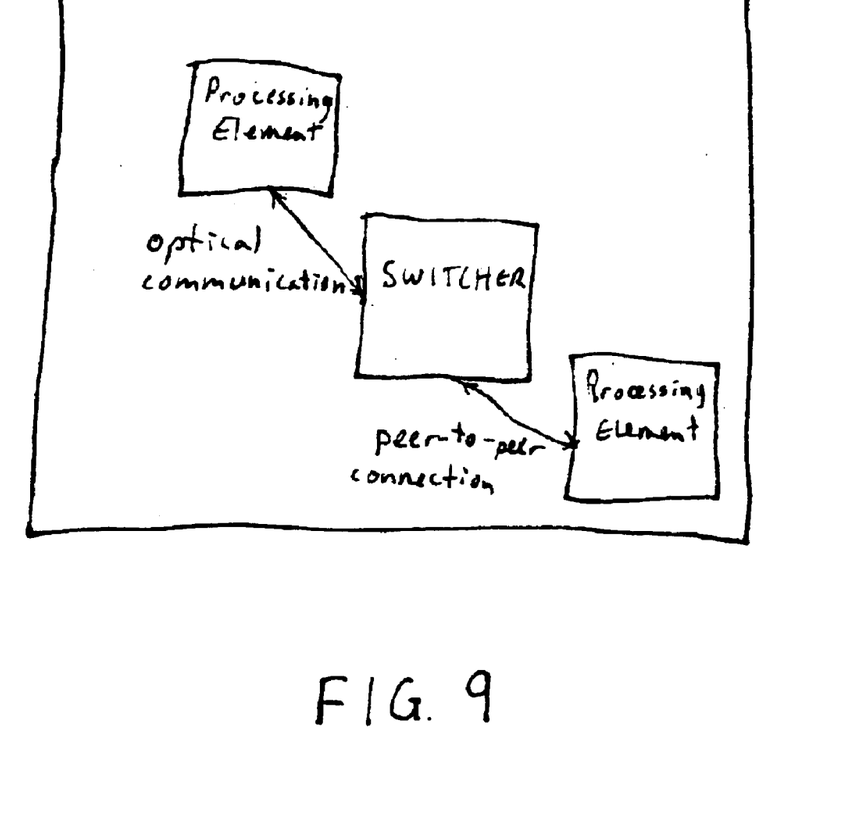
FIG. 9 shows a diagram representing a system using optical communication and peer-to-peer connection.

As shown in FIG. 9, a switcher connects at least one processing element by a peer-to-peer connection and the switcher optically communicates with at least one processing element.

DESCRIPTION OF THE PREFERRED EMBODIMENT

At first, description is made about the first conventional system mentioned above with reference to FIGS. 1. The system LSI 700 shown in FIG. 1 includes a core processor 701, and peripheral I/O processors 702 and 703 located on a single chip. Each of the processors 701, 702, and 703 is provided in a form of IP which is already designed. The peripheral I/O processors 702 and 703 are connected to outside via I/O ports 712 and 713, respectively.

Figure 1:
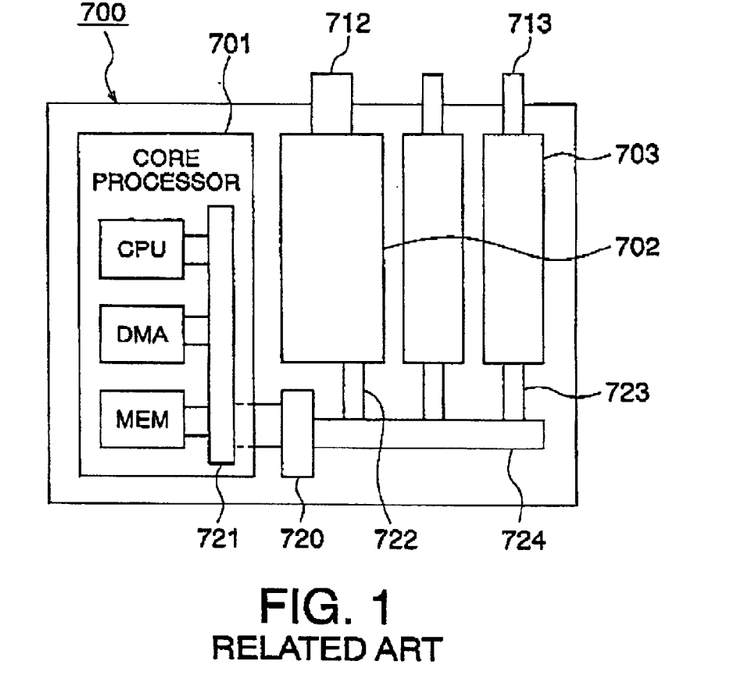
FIG. 1 shows a diagram representing a first conventional system.

The core processor 701 includes a CPU (Central Processing Unit) and a DMA (Direct Memory access) each of which is connected to a common bus (a local processor bus 721). The peripheral I/O processors 702 and 703 have common interfaces 722 and 723, respectively. And the common interfaces 722 and 723 are connected to an on-chip peripheral bus 724 which is formed as a common bus in the chip. In addition, in the system LSI 700, a local processor bus 721 of the processor 701 is connected to the on-chip peripheral bus 724 via a bridge 720 to form the common bus of the chip.

Next, description is made about the second conventional system mentioned above with reference to FIG. 2. The communication function built-in type LSI 810 includes a micro computer 811 and a communication interface 812. The plurality of communication interfaces 812 corresponding to the plurality of LSIs 810 are connected to a single network bus 820 which works a common bus, to form a sub network.

Figure 2:
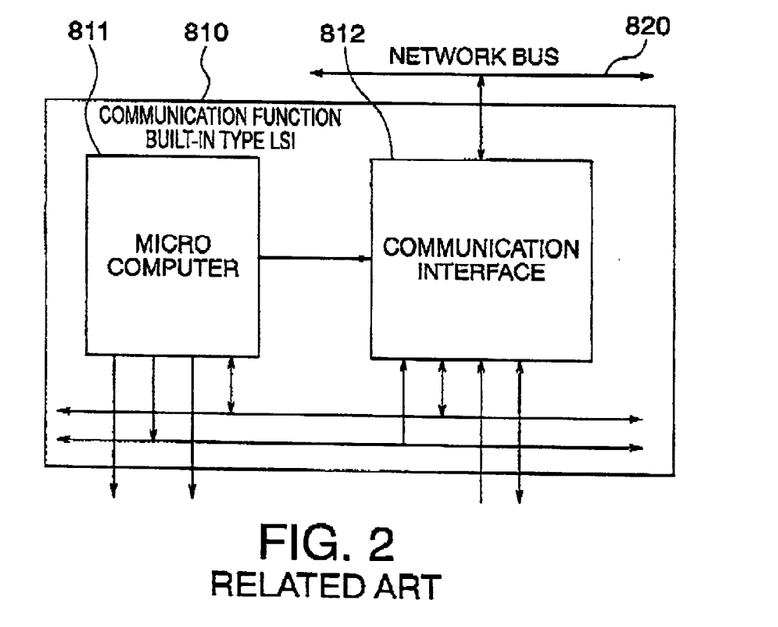
FIG. 2 shows a diagram representing a second conventional system.

The sub network selects an LSI 810 among the LSIs 810 connected to the sub network as a gateway for a higher hierarchy network. In addition, the sub network connects the gateway to an outside data terminal and an outside address terminal of a micro computer of an LSI belonging to the higher hierarchy network.

Then a semiconductor device according to the invention is described with reference to FIGS. 3 to 8.

The semiconductor device of the invention is associated with a system LSI (Large Scale Integration). A design of the system LSI begins with a hierarchy design for an algorithm of abstract concept, according to a specification as required. In the hierarchy design of the algorithm, required function levels are defined from the lowest function level to a higher function level. For example, voice coding or filtering belongs to the function level.

A die (chip) can be identified in some physical hierarchical levels including block level, sub-block level, and cell level. Each module used as a circuit part is referred to as an LSI, and is classified into a single chip module which includes a single chip and a multi-chip module which includes a plurality of chips. The LSI is produced by locating at least one module on a package or is produced by using a plurality of packages when it is large in size.

A function block can be divided into a plurality of sub function blocks. On the other hand, by combining a plurality of sub function blocks, a function block can be formed. In this way, a system is firstly hierarchically divided into some function levels. A processing element is designed for each hierarchically divided function block.

Next, mapping of a processing module is performed to, for example, establish a function block required as a processing element. Herein, the processing module means a physical entity to realize at least one function block. Therefore, implementation such as circuit design or programming is performed for the processing module. The processing module includes, for example, a core processor and a peripheral I/O processor. The processing module also includes a CPU, a memory, and a hard wired logic and hierarchically divided in a similar manner to the above mentioned function block.

It is desirable that a function block in a hierarchical level corresponds to a processing module in a hierarchical level since a system can be more clearly understood and independency and flexibility of a module can be increased. However, the correspondence is not always required.

On the other hand, to keep the independency and the flexibility of the processing modules mapping of the processing module over a plurality of logical function blocks is forbidden.

Figure 3:
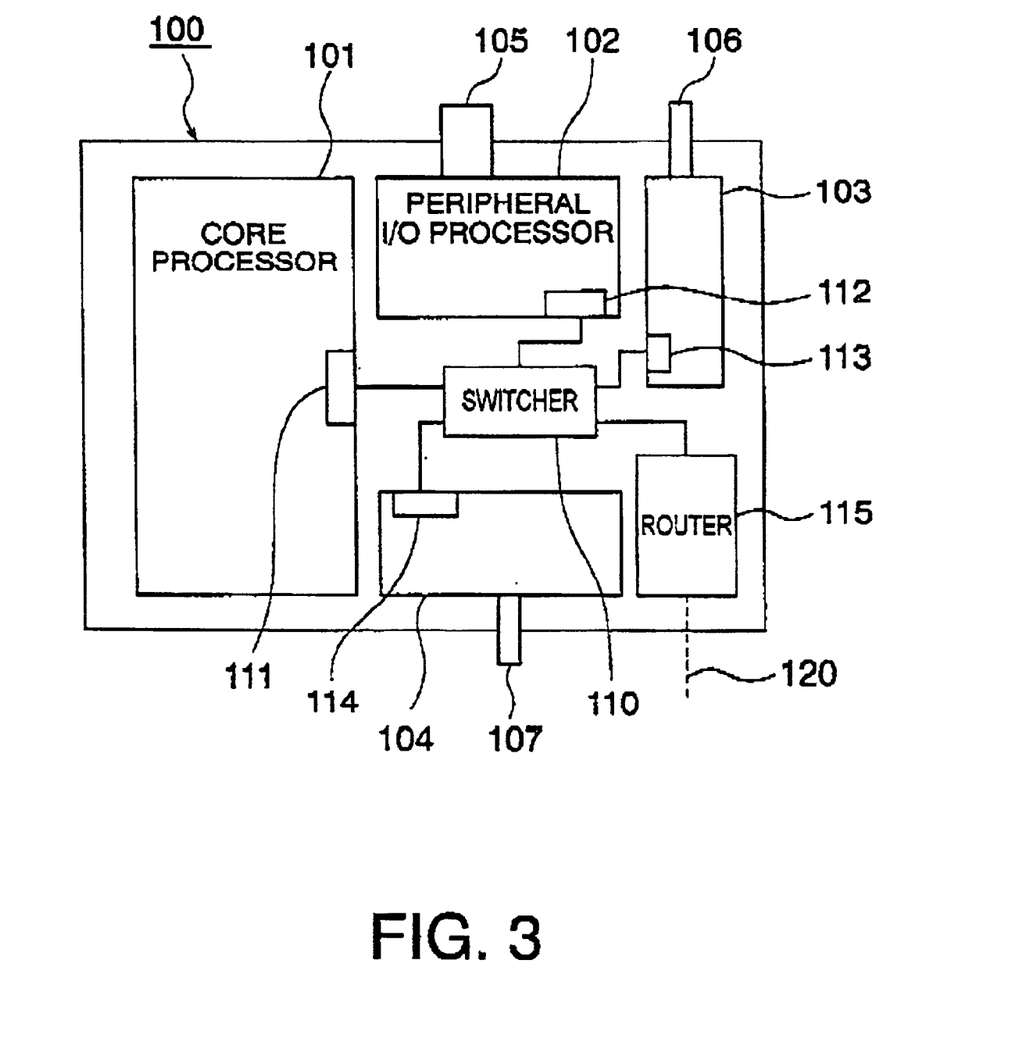
FIG. 3 shows a diagram for describing an embodiment of a system of the invention.

Next, description is made about an embodiment of the invention with reference to FIG. 3.

A system LSI 100 shown in FIG. 3 includes a plurality of processing modules, that is, a core processor 101, peripheral I/O processors 102, 103, and 104, and a switcher 110. Further, the processors 101, 102, 103, and 104 are located around the switcher 110.

The core processor 101 and the peripheral I/O processors 102, 103, and 104 include network interfaces 111, 112, 113, and 114, respectively, as sub modules for data communication. Also, the peripheral I/O processors 102, 103, and 104 further include I/O ports 105, 106, and 107, respectively, for connecting to outside.

The switcher 110 is directly connected to the network interfaces 111, 112, 113, and 114 of the processors 101, 102, 103, and 104, and provides communication function between the processors. Any communication system can be used here as far as the system is a single unified digital communication method.

In such the construction, a connection path between the processors each of which is a processing module forms a system LSI. For example, the switcher 110 connecting two processors and two links each of which connects the switcher to one of the two processors form a system LSI. Also, a network forming the link is a network of transmission lines for transmitting signals and data excepting a power cable. The signals and data are transferred through a peer-to-peer connection. With this structure, the number of core wires of each transmission line in the network may be one or two.

In the above description, the system LSI is composed of a plurality of modules packaged. However, it may be a module LSI including a plurality of chips and a center chip which is located at the center of the chips and which is operable as the switcher. Alternatively, the system LSI is formed by a chip LSI including a plurality of blocks and a switcher. The switcher includes an IP and, each processing module includes an IP of a unique function and an IP of a sub processing module interfacing with the switcher. Thereby, independency and flexibility of the processing module can be enhanced.

Also, as shown in FIG. 3, the illustrated system LSI 100 further includes a router 115. The router 115 is connected to the switcher 110, and the outside system LSI router via an outside communication port 120.

Figure 4:
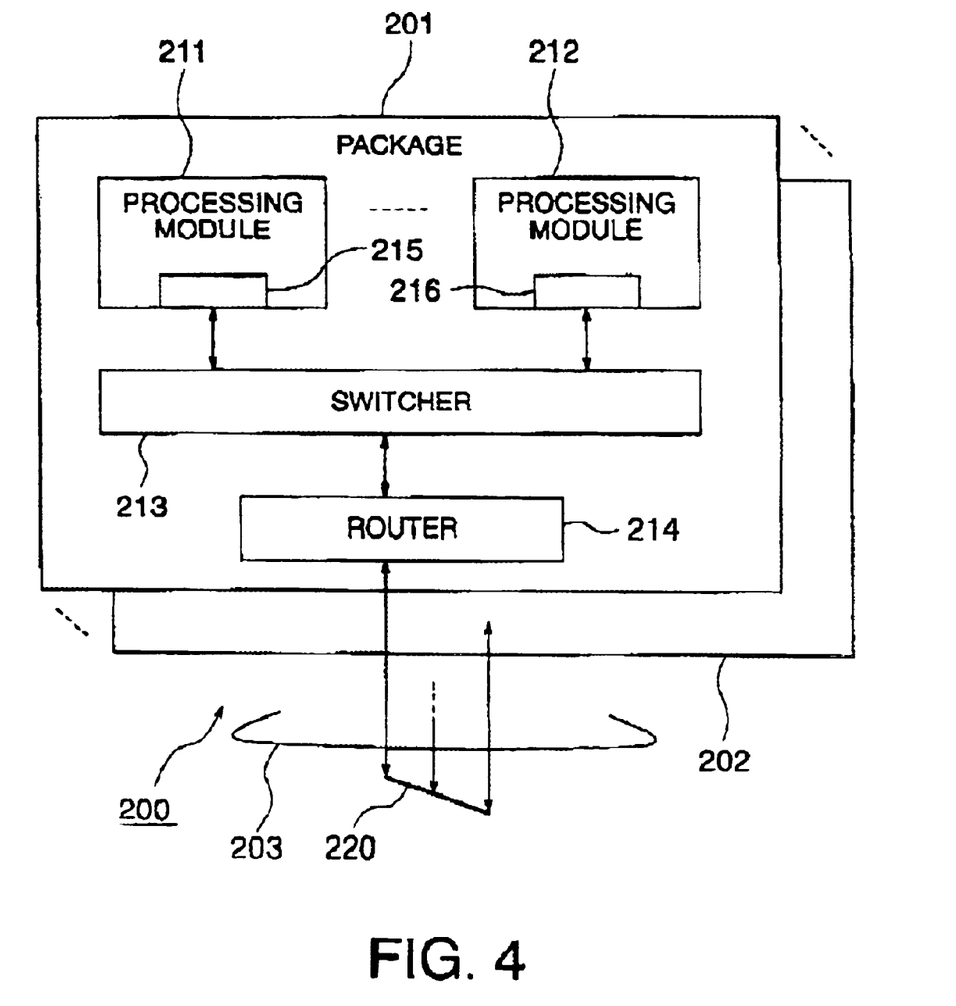
FIG. 4 shows a diagram schematically representing a system shown in FIG. 3, laminating and coupling a number of packages.

Then, description is made about a stacked LSI with reference to FIG. 4.

FIG. 4 schematically shows a system LSI 200 which is produced by laminating or stacking a plurality of packages 201 and 202 in a vertical direction to the package face and connecting between the packages via a communication path 203.

Also, the system LSI 200 is shown in FIG. 4 simply for description. The package 201 includes a plurality of processing modules 211 and 212, a switcher 213, and a router 214. The processing modules 211 and 212 includes network interfaces 215 and 216, respectively. And the network interfaces 215 and 216 are connected to each other via the switcher 213. If the switcher 213 determines that a destined address is an address of the other package, connection is made between the processing module and an outside communication port 220 via the router 214. Then, data can be transferred from the router 214 to the address of the other package via a router of the other package.

Also in the system LSI, the switcher is located at the center of the package, as shown in FIG. 4, Therefore, the system LSI is capable of having the same effect as the system LSI shown in FIG. 3. Further, a fewer number of wires are required for wiring, although each of the required wires has a different length from each other between the packages.

Figure 5:
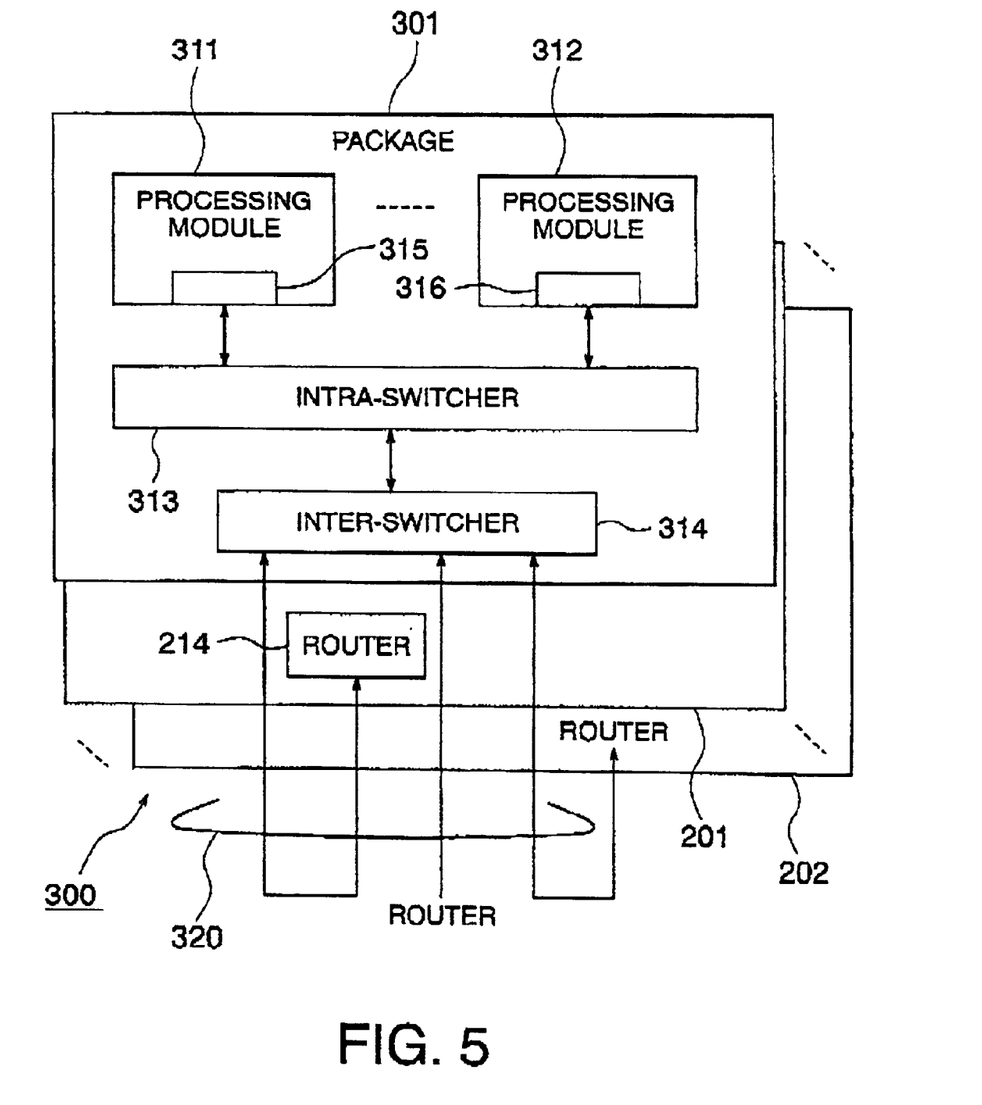
FIG. 5 shows a diagram schematically representing another system shown in FIG. 4.

Then, description is made about another LSI having laminated packages with reference to FIG. 5.

A system LSI 300 shown in FIG. 5 includes the laminated packages (201, 202) and a package 301.

The package 201 and the plurality of the packages 201 and 202 are connected to each other via extra communication port 320 which as located outside the package. This is the difference between the system LSI shown in FIG. 4 and the system LSI shown in FIG. 5. Also, the package 301 includes an intra-switcher 313 which internally connects a plurality of processing modules 311 and 312, and an inter-switcher 314 which connects the packages. The processing modules 311 and 312 include network interfaces 315 and 316, respectively.

In the package 301, the intra-switcher 313 is located at the center of the package in a similar way to the above-mentioned packages. And the inter-switcher 314 which is placed instead of the router 214 of the package 201 is connected to routers 214 of the packages 201 and 202 via the extra communication port 320.

The intra-switcher 313 may have the same functions as the above-mentioned switchers 110 and 213. However, the inter-switcher 314 serves as a gateway of the package and is required to have a circuit switching function.

In the examples of three-dimensional implementation shown in FIGS. 4 and 5, the plurality of packages can be basically connected via a transmission line excepting a power cable, and thereby restriction of wiring can be reduced.

Also, as shown in FIG. 5, the plurality of processing modules 311 and 312 and the inter-switcher 314 are located on a single plane (package), that is, they are implemented two-dimensionally.

Figure 6:
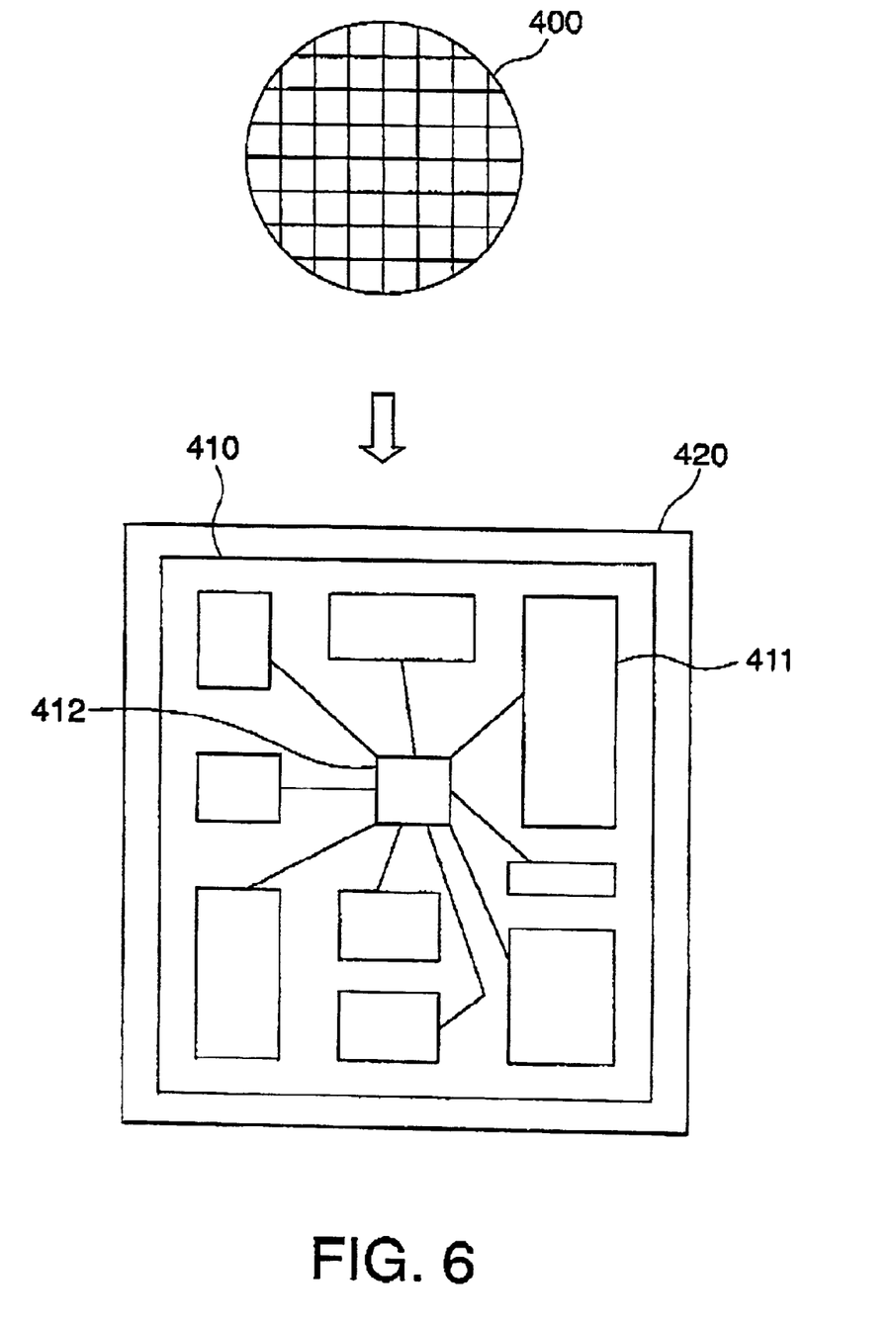
FIG. 6 shows a diagram representing a system which is formed by a single chip module according to an embodiment of the invention.

In FIG. 6, a system LSI is shown which is composed of a single chip module produced by forming a die 410 made from a silicon wafer 400 in a package 420. In the die 410, there are a switcher 412 located at the center of the die and a plurality of processing modules 411 located around the switcher. The die can perform the same function as the system LSI shown in FIG. 3.

Figure 7:
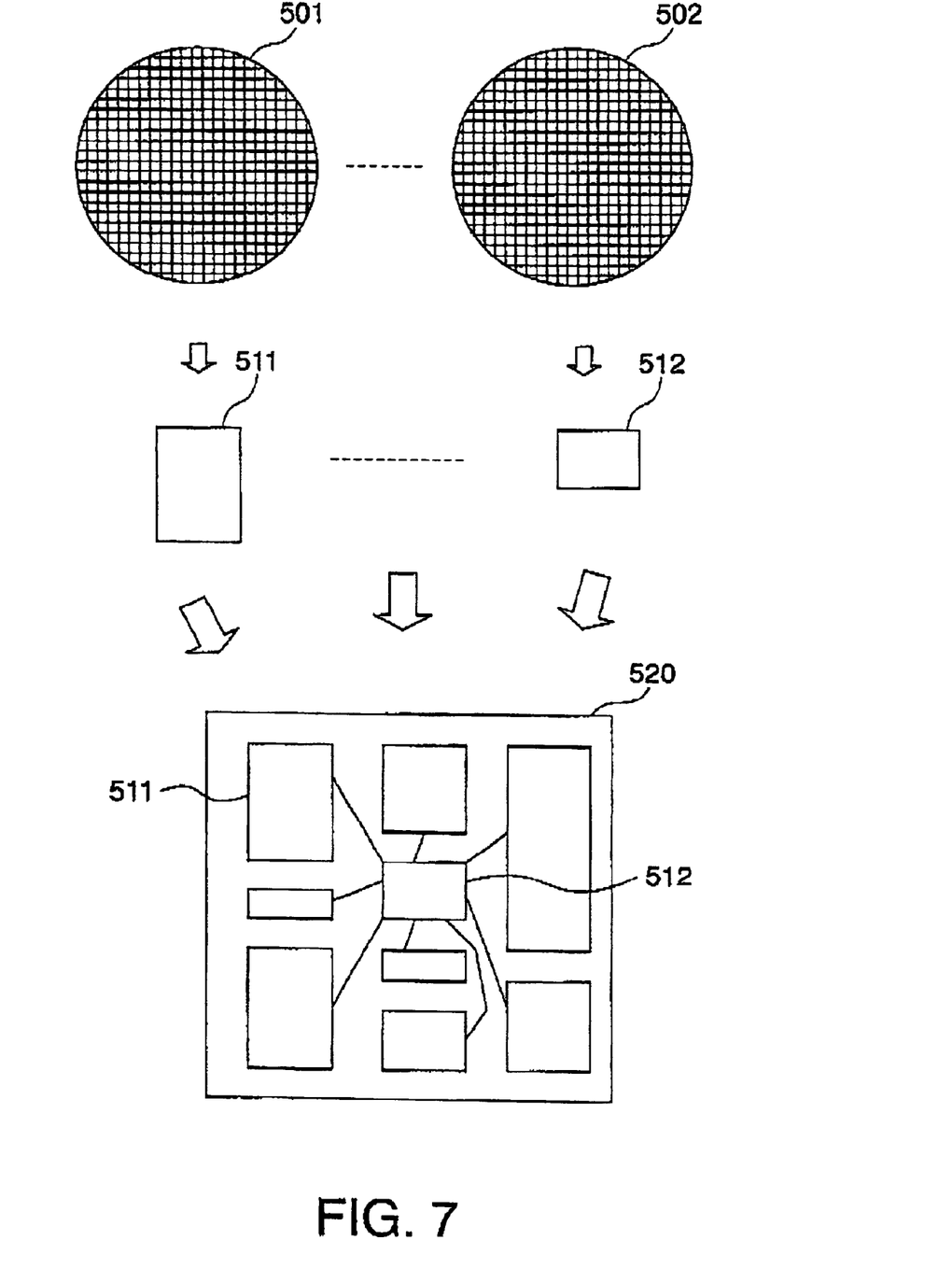
FIG. 7 shows a diagram representing a system which is formed by a multi-chip module according to an embodiment of the invention.

In FIG. 7, a system LSI is shown which is composed of a multi-chip module forming dies 511 and 512 which are made, as processing modules, from silicon wafers 501 and 502, respectively in a package 520. In the package 520, there are a die 512 (which serves as a switcher) located at the center of the package and a plurality of dies 511 (which serves as processing modules) located around the die 512 and connected to the die 512. The package 520 can perform the same functions as the system LSI shown in FIG. 3.

Figure 8:
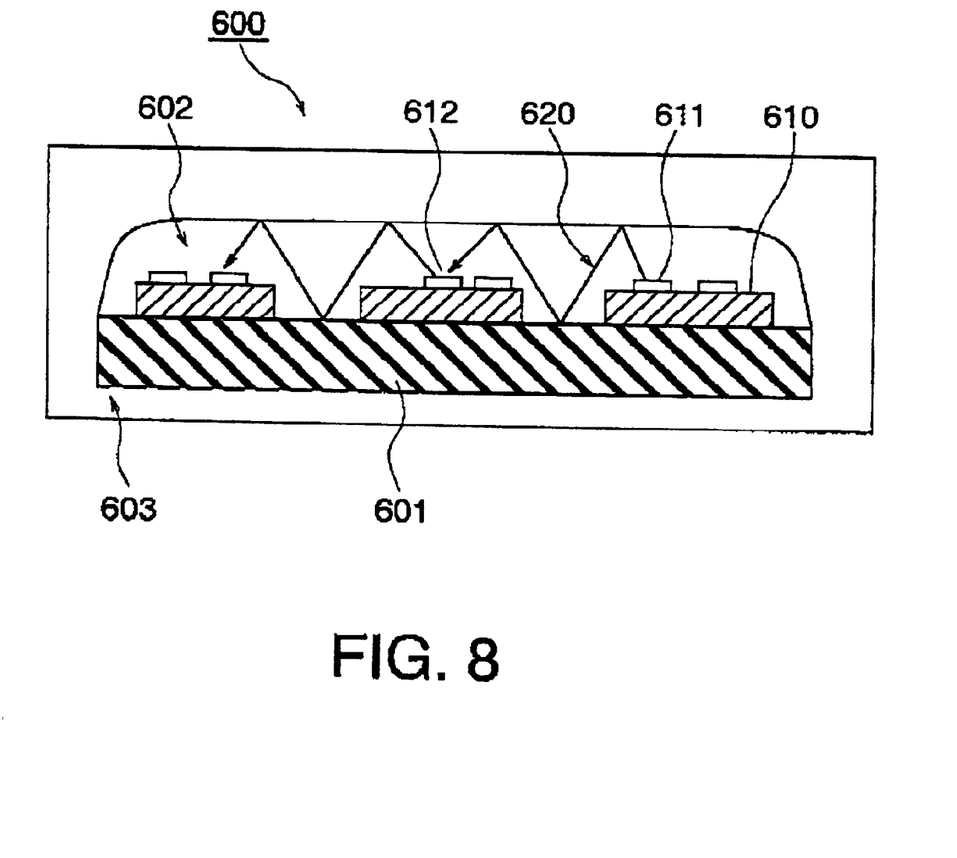
FIG. 8 shows a diagram representing a system using an optical communication according to an embodiment of the invention.

In a system LSI shown in FIG. 8, connection between packages is not done by wiring but is realized optically.

The package 600 is based on a multi-chip module forming a plurality of semiconductor chips 610 on a surface of a package substrate 601. Around the multi-chip module, sealing is done by a sealing resin 602. Further, a sealing resin 603 is used to seal the substrate 601 and the sealing resin 602. As a result, a light signal 620 from a light emitting element 611 is cinfined inside the sealing resin 602.

From a plurality of semiconductor chips 610, one chip which is located at the center of the package substrate 601 is selected and the selected chip is constructed as a switcher (not shown in FIG. 8). Also, in the semiconductor chip 610, the light emitting element 611 and a light receiving element 612 are placed.

As shown in FIG. 9, a swithcher connects at least one processing element by a peer-to-peer connection and the switcher optically communicates with at least one processing element.

Description has been made about specific embodiments, but a scope of the invention should not be limited to these embodiments. For example, the switcher can be located at the die, the chip, or the module. Also, in the above description, the router or the inter-switcher can be used to connect between the laminated packages, but they can be used to connect between the laminated modules. Thus, a different configuration of a different hierarchical level can be used as far as the above-mentioned functions are achieved.

Therefore, the invention is at first advantageous in that consideration may not be made about a delay due to wiring of the processing elements. This is because the wiring between the processing elements is done via a switcher and then, the shortest wiring is achieved for each connection between the processing elements.

Second, the invention is advantageous in that the number of transmission lines is reduced to one or two and wiring is simplified, since sending or receiving of data between the processing elements is done by communication process of signals and data, Third, the invention is advantageous in that an independency and a flexibility of the processing elements are improved, and it is easy to reuse the processing element and to combine the processing elements for a new system configuration, since an interface (including the communication process) between the processing elements is based on a certain protocol.

Fourth, the invention is advantageous in that a degree of division of labor is increased, a yield of products is improved (that is, a manufacturing process can be separated into various sub processes), and a production cost can be reduced. This makes it possible to manufacture a wide variety of products by combining only non-detective elements with one another, as mentioned above.

It is a fifth effect of the invention that it is easy to perform a unit test for processing elements incorporated into a system LSI, since the processing elements are separated by a switch and one of the processing elements is independent of the other elements.

Further, it is possible to perform high-speed transmission of a signal because of shortening wiring (the above-mentioned first advantage) and simplifying the system LSI )(the second advantage). And in particular, problems of a cross talk and a delay due to wiring can be solved, since a density of wiring in a long distance connection can be reduced.

As described above, a flexibility of design of layout and wiring of a semiconductor device such as a system LSI can be improved, and production of the system LSI (including a test) can be simplified.

What is claimed is:

1. An LSI semiconductor device comprising:
a plurality of processing elements; and
a single switcher that connects each of the plural processing elements to each other,
wherein each of the plural processing elements includes a network interface and is connected to the single switcher via the network interface,
wherein the plural processing elements are located at a plurality of sides of the single switcher,
wherein one of the plural processing elements and the single switcher are connected by peer-to-peer connection via at least one transmission line,
wherein a connection path between said plural processors forms a system LSI, and
wherein the plural processing elements and the single switcher are implemented in a single semiconductor chip to form a chip LSI.

2. The semiconductor device of claim 1, wherein the switcher is located at the center position of the semiconductor device.

3. The semiconductor device of claim 1, wherein the plural processing elements and the single switcher are implemented in a single package.

4. The semiconductor device of claim 1, wherein each of the plural processing elements has a function of the same hierarchical level.

5. The semiconductor device of claim 1 further comprising:
a plurality of semiconductor chips each of which includes plural processing elements and a single switcher; and
at least one inter-switcher which connects the semiconductor chips to each other.

6. The semiconductor device of claim 5, wherein the inter-switcher is located in one of the plural semiconductor chips, and the plural semiconductor chips are implemented on a plurality of stacked packages.

7. The semiconductor device of claim 5, wherein each switcher of the plural semiconductor chips and the inter-switcher is structured and arranged to have a circuit switching function.

8. The semiconductor device of claim 1, wherein each of the plural processing elements are only connected to the single switcher, through each respective network interface.

9. An LSI semiconductor device comprising:
a plurality of processing elements; and
a single switcher that connects each of the plural processing elements to each other,
wherein each of the plural processing elements includes a network interface and is connected to the single switcher via the network interface,
wherein the plural processing elements are located at a plurality of sides of the single switcher,
wherein one of the plural processing elements and the single switcher are connected by peer-to-peer connection via at least one transmission line,
wherein a connection path between said plural processors forms a system LSI, and
wherein at least one of the plural processing elements and the single switcher are located in a space where light is confined, and each of the at least one of the plural processing elements and the single switcher has a light emitting element and a light receiving element, wherein an optical communication is performed between the at least one of the plural processing elements and the single switcher.

10. The semiconductor device of claim 9, wherein the light is confined by a sealing resin.

* * * * *